(12) United States Patent
Kwon et al.

(10) Patent No.: US 9,930,817 B2
(45) Date of Patent: Mar. 27, 2018

(54) SHIELD CAN OF MOBILE TERMINAL

(71) Applicant: Samsung Electronics Co., Ltd., Suwon-si, Gyeonggi-do (KR)

(72) Inventors: Oh Hyuck Kwon, Suwon-si (KR); Kyung Jin Oh, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/680,576

(22) Filed: Apr. 7, 2015

(65) Prior Publication Data

US 2015/0216091 A1    Jul. 30, 2015

Related U.S. Application Data (63) Continuation of application No. 14/099,089, filed on Dec. 6, 2013, now Pat. No. 9,018,542, which is a continuation of application No. 12/977,767, filed on Dec. 23, 2010, now Pat. No. 8,629,355.

(30) Foreign Application Priority Data

Dec. 24, 2009  (KR) .................. 10-2009-0130362

(51) Int. Cl.
| | |
|---|---|
| *H05K 9/00* | (2006.01) |
| *H04B 15/04* | (2006.01) |
| *H04M 1/02* | (2006.01) |
| *H05K 1/18* | (2006.01) |

(52) U.S. Cl.
CPC ............ *H05K 9/003* (2013.01); *H04B 15/04* (2013.01); *H04M 1/026* (2013.01); *H05K 1/181* (2013.01); *H05K 9/006* (2013.01); *H05K 9/0022* (2013.01); *H05K 9/0037* (2013.01)

(58) Field of Classification Search
CPC ..................................................... H05K 9/0037
USPC ......................................................... 455/575.1
See application file for complete search history.

(56) References Cited

U.S. PATENT DOCUMENTS

| | | | |
|---|---|---|---|
| 5,070,216 A | 12/1991 | Thornton | |
| 5,150,282 A * | 9/1992 | Tomura | ............... H04B 1/3833 174/367 |
| 5,566,055 A | 10/1996 | Salvi, Jr. | |
| 5,644,101 A | 7/1997 | Elliott | |
| 6,037,846 A | 3/2000 | Oberhammer | |
| 6,242,690 B1 | 6/2001 | Glover | |
| 6,958,445 B1 | 10/2005 | Boudreaux et al. | |
| 7,326,862 B2 * | 2/2008 | Lionetta | ............... H05K 9/0032 174/370 |
| 8,247,889 B2 | 8/2012 | Liao et al. | |

(Continued)

FOREIGN PATENT DOCUMENTS

| | | |
|---|---|---|
| JP | 11-186774 A | 7/1999 |
| KR | 20-0143630 Y1 | 1/1999 |

(Continued)

*Primary Examiner* — Hung V Ngo
(74) *Attorney, Agent, or Firm* — Jefferson IP Law, LLP (57) ABSTRACT

A shield can of a mobile terminal is provided. The shield can of the mobile terminal includes: at least one shield can installed in a main circuit board of the mobile terminal, and at least one separation wall formed between electronic elements in which electromagnetic interference occurs within the shield can. Hence, shield ability can be improved and simplified manufacturing process of the separation wall can reduce cost.

20 Claims, 5 Drawing Sheets

(56) References Cited

U.S. PATENT DOCUMENTS

2005/0277448 A1* 12/2005 Castaneda ............... H04M 1/23
                                                   455/575.1
2010/0105452 A1    4/2010 Shin et al.

FOREIGN PATENT DOCUMENTS

KR    10-2000-0054452 A    9/2000
KR    10-2008-0037361 A    4/2008

* cited by examiner

SHIELD CAN OF MOBILE TERMINAL

PRIORITY

This application is a continuation of U.S. patent application Ser. No. 14/099,089, filed on Sep. 6, 2013, which is a continuation of U.S. patent application Ser. No. 12/977,767, filed on Dec. 23, 2010, which has issued as U.S. Pat. No. 8,629,355, issued on Jan. 14, 2014, which claimed the benefit under 35 U.S.C. § 119(a) of a Korean patent application filed on Dec. 24, 2009 in the Korean Intellectual Property Office and assigned serial number 10-2009-0130362, the entire disclosure of each of which is hereby incorporated by reference.

BACKGROUND OF THE INVENTION

1. Field of the Invention

The present invention relates to a shield can of a mobile terminal. More particularly, the present invention relates to a shield can of a mobile terminal having a separation wall formed on a main circuit board within the shield can.

2. Description of the Related Art

In general, electromagnetic waves are used for radio communication or satellite communication. However, electromagnetic waves may have a negative influence on operation of an electronic device. Such a phenomenon is referred to as an electromagnetic interference (EMI) phenomenon. EMI operates as a noxious element to a human body and enables an electronic device to cause noise.

Therefore, nowadays, as electronic components such as a semiconductor element mounted on a Printed Circuit Board (PCB) within an electronic device are covered by a predefined shield can, EMI occurring in the electronic components is shielded. This is because operation of an electronic device with another electronic device is not abnormally influenced by EMI. The shield can is formed in a box form having an opened lower portion in order to cover an electronic component.

A method of molding a shield can in a PCB in order to exhibit Radio Frequency (RF) performance and prevent various EMI of a mobile terminal is classified into two methods.

One method is to couple a clip to a ground portion of the PCB and to insert the shield can into the clip.

Another method is to expose a ground portion to the PCB and to directly ground a circumferential edge wall of the shield can, i.e. a side surface to the ground portion.

Due to a decrease in size and an increase in function of a mobile terminal, rather than a method of enclosing electronic components in one shield can, modules can be separated on the PCB, i.e. a plurality of electronic elements can be separated into several blocks. Therefore, a plurality of blocks can be separated using a plurality of shield cans. However, when a plurality of shield cans are used, side surfaces of contacting shield cans are overlapped and thus becomes thick, thereby reducing space use ratio.

Therefore, a need exists for a shield can of a mobile terminal having a separation wall formed with a plurality of gaskets surface-mounted on a main circuit board within the shield can.

SUMMARY OF THE INVENTION

An aspect of the present invention is to address at least the above-mentioned problems and/or disadvantages and to provide at least the advantages described below. Accordingly, an aspect of the present invention is to provide a shield can of a mobile terminal having a separation wall formed with a plurality of gaskets surface-mounted on a main circuit board within the shield can.

In accordance with an aspect of the present invention, a shield can of a mobile terminal is provided. The shield can includes at least one shield can installed in a main circuit board of the mobile terminal, and at least one separation wall formed between electronic elements in which electromagnetic interference occurs within the shield can.

The separation wall is formed with a plurality of gaskets.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

FIGS. 1 through 5, discussed below, and the various exemplary embodiments used to describe the principles of the present disclosure in this patent document are by way of illustration only and should not be construed in any way that would limit the scope of the disclosure. Those skilled in the art will understand that the principles of the present disclosure may be implemented in any suitably arranged communications system. The terms used to describe various embodiments are exemplary. It should be understood that these are provided to merely aid the understanding of the description, and that their use and definitions in no way limit the scope of the invention. Terms first, second, and the like are used to differentiate between objects having the same terminology and are in no way intended to represent a chronological order, unless where explicitly state otherwise. A set is defined as a non-empty set including at least one element.

Figure 1:
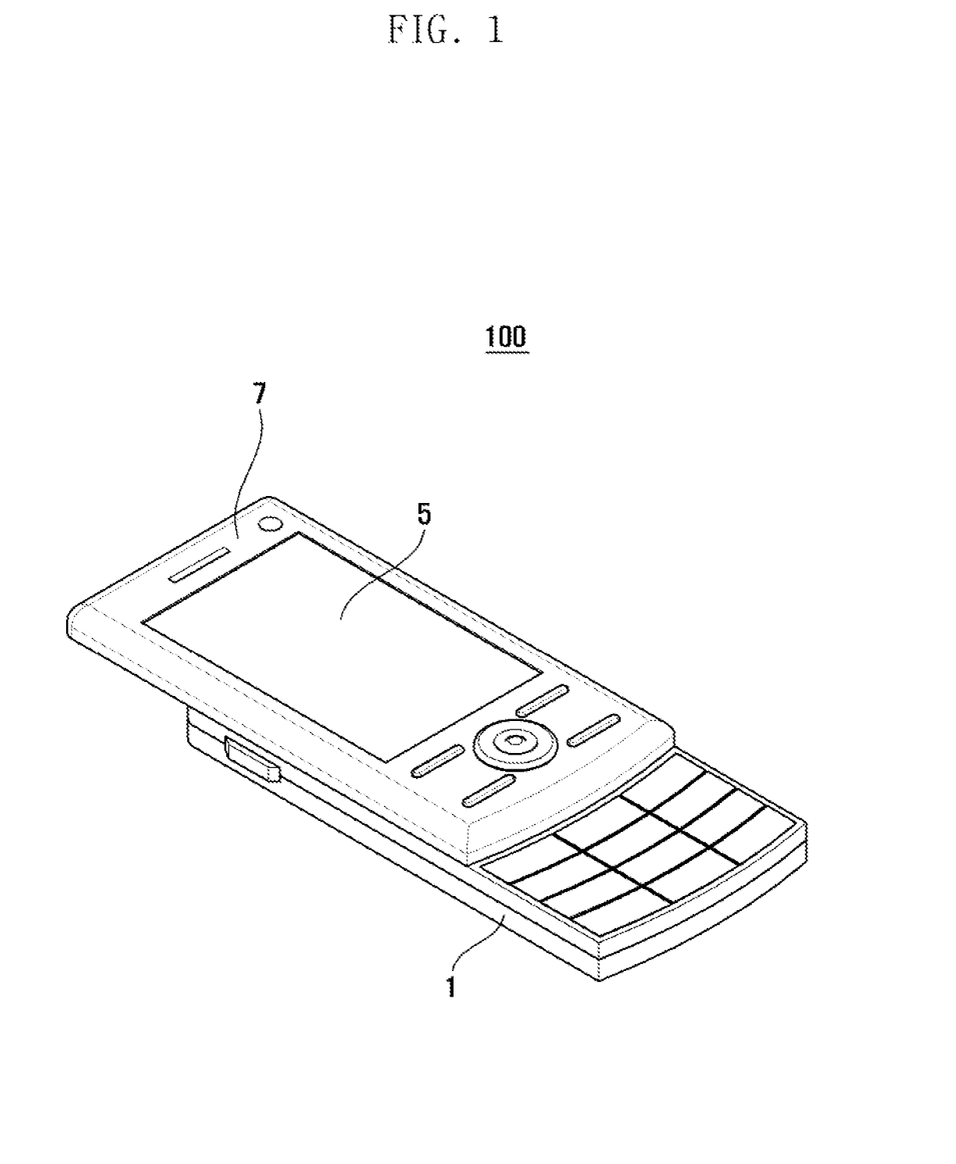
FIG. 1 is a perspective view illustrating a mobile terminal according to an exemplary embodiment of the present invention.

FIG. 1 is a perspective view illustrating a mobile terminal according to an exemplary embodiment of the present invention.

Referring to FIG. 1, a mobile terminal 100 may include a folder type terminal and a slide type terminal, and for convenience of description, it is assumed that the mobile terminal 100 is as a slide type terminal. The mobile terminal 100 includes a main body 1, wherein in an upper part of the main body 1, a display unit 5 is installed and a slide unit 7 that can perform a sliding movement is coupled to the upper part of the main body 1.

Referring to FIGS. 1 to 5, the mobile terminal 100 of the present exemplary embodiment includes a main circuit board 10, a shield can 20, and a gasket 30.

Figure 2:
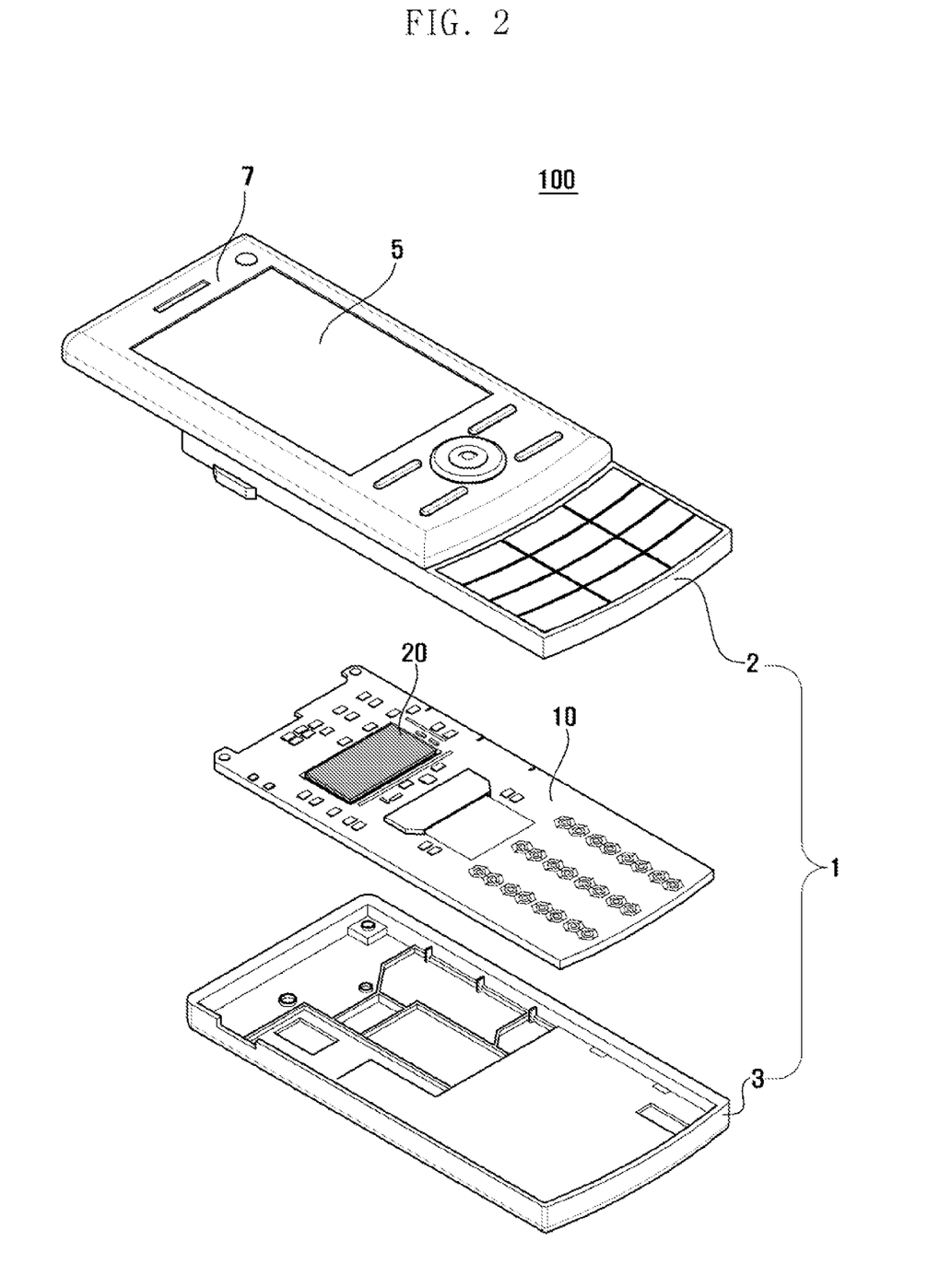
FIG. 2 is an exploded perspective view of a mobile terminal according to an exemplary embodiment of the present invention.

FIG. 2 is an exploded perspective view of the mobile terminal according to an exemplary embodiment of the present invention.

Figure 3:
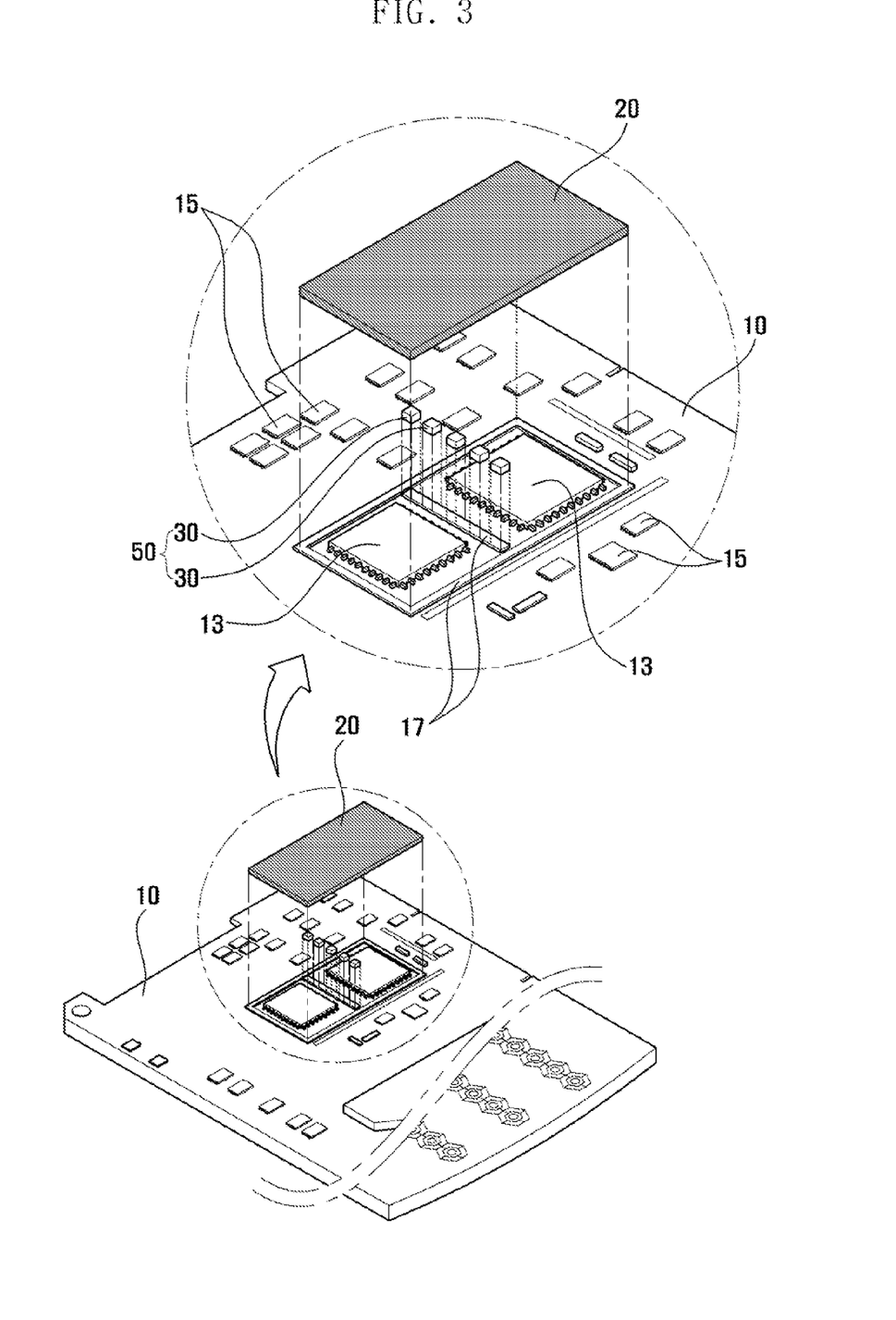
FIG. 3 is an exploded perspective view illustrating a configuration of a shield can of a mobile terminal according to an exemplary embodiment of the present invention.

FIG. 3 is an exploded perspective view illustrating a configuration of a shield can of the mobile terminal according to an exemplary embodiment of the present invention.

Referring to FIGS. 2 and 3, the main circuit board 10 is installed within a main body 1 of the mobile terminal 100, and the main body 1 includes an upper case 2 and a lower case 3. The main circuit board 10 may be a Printed Board Assembly (PBA) in which a plurality of electronic elements 13 and 15 are mounted or bonded to a Printed Circuit Board (PCB) and are processed. As indicated above, a display unit 5 is installed in an upper part of the main body 1 and a slide unit 7 that can perform a sliding movement is coupled to the upper part of the main body 1.

The shield can 20 is installed on the main circuit board 10 to separate electronic elements 13 and 15 causing electromagnetic interference from each other. Therefore, a shield film is formed by the shield can 20 and thus electromagnetic interference between internal electronic elements 13 of the shield can 20 and external electronic elements 15 of the shield can 20 is prevented.

A separation wall 50 is formed between electronic elements causing electromagnetic interference among the internal electronic elements 13 housed in the shield can 20. The separation wall 50 of the shield can 20 is formed with a plurality of gaskets 30 surface-mounted on the main circuit board 10. Therefore, the separation wall 50 formed with the plurality of gaskets 30 prevents electromagnetic interference from occurring between the internal electronic elements 13.

Moreover, the shield can 20 is formed in a box shape having a hollow inner portion and an opened one surface and can house some or all of the plurality of electronic elements 13 and 15 mounted in an upper surface of the main circuit board 10. The shield can 20 is made of a conductive material and is made of a hard material in order to protect various electronic elements of the main circuit board 10 from an external impact. As a side surface of the shield can 20 is soldered and fixed to a ground portion 17 of the main circuit board 10, the shield can 20 is coupled to the main circuit board 10.

The ground portion 17 may have a ground pattern formed on the main circuit board 10. The ground portion 17 is connected to a ground layer of the main circuit board 10.

In an exemplary embodiment of the present invention, as the internal electronic elements 13 of the plurality of electronic elements 13 and 15 are housed in the shield can 20, electromagnetic interference can be prevented from occurring between the internal electronic elements 13 and the external electronic elements 15. That is, electromagnetic waves occurring between the internal electronic elements 13 and the external electronic elements 15 flow to the ground layer through the ground portion 17 along a surface of the shield can 20 and are thus removed.

The internal electronic elements 13 are electronic elements that may cause an abnormal operation when exposed to electromagnetic interference and may be, for example, a Radio Frequency (RF) module or a Digital Multimedia Broadcasting (DMB) module.

The external electronic elements 15 may be a module for performing a function other than communication, i.e. components related to logic, for example, a Liquid Crystal Display (LCD) module, a Central Processing Unit (CPU), and a key module.

The plurality of electronic elements 13 and 15 may be divided into several blocks, and at least one shield can 20 may be installed in the blocks, as needed. Furthermore, all of the plurality of electronic elements 13 and 15 may be housed in one shield can 20.

Figure 4:
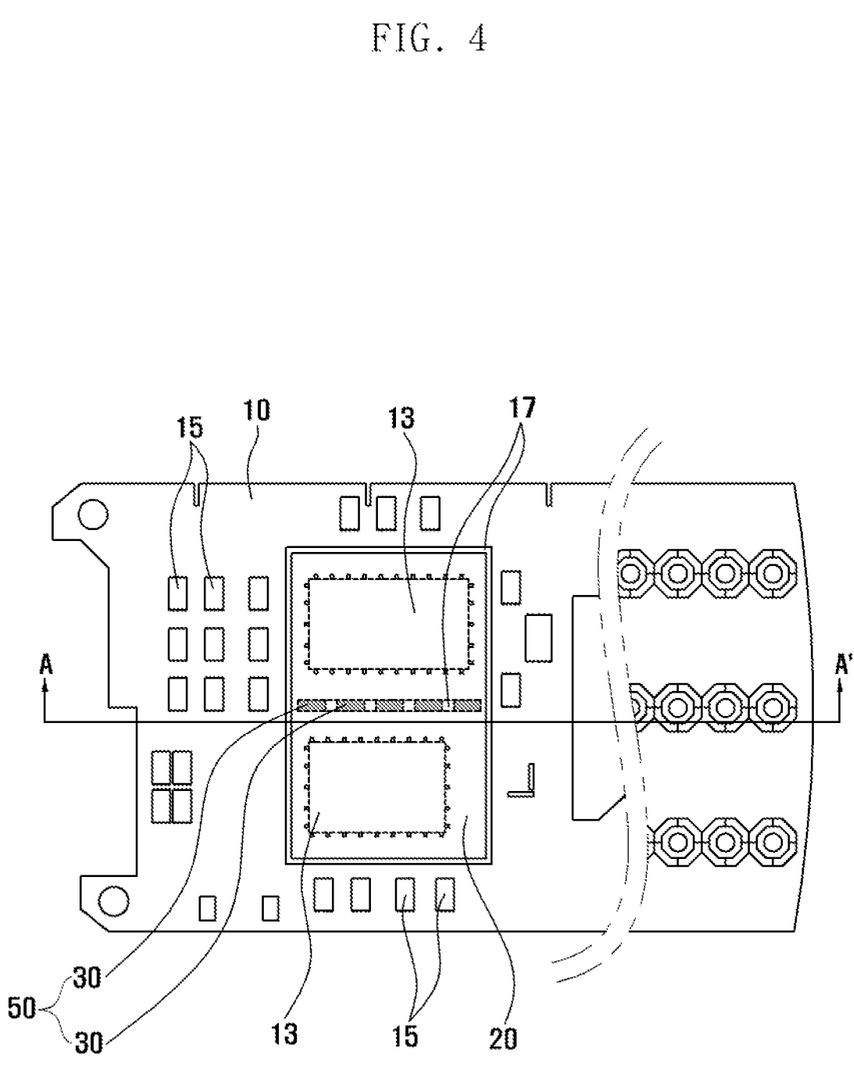
FIG. 4 is a plan view illustrating a shield can of a mobile terminal according to an exemplary embodiment of the present invention.
Figure 5:
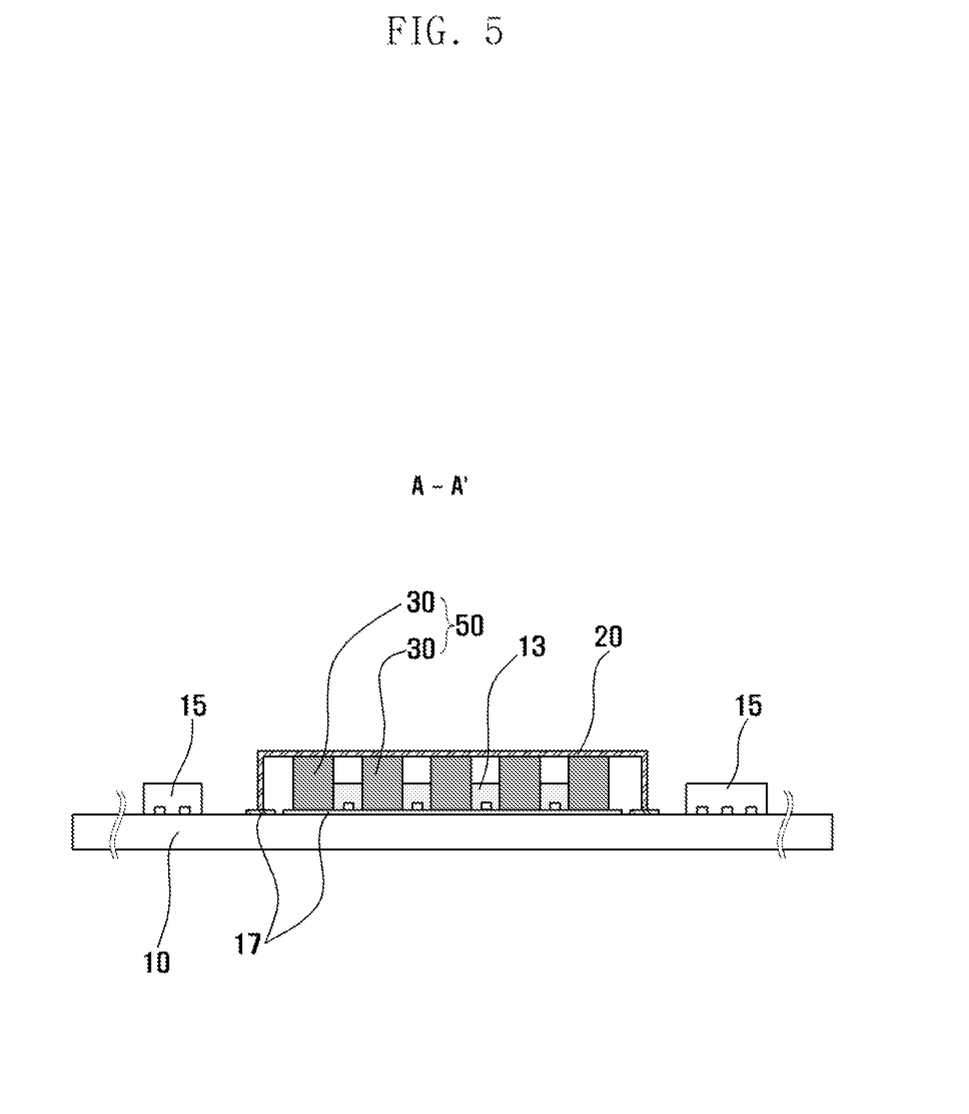
FIG. 5 is a side cross-sectional view of a shield can of a mobile terminal according to an exemplary embodiment of the present invention.

Referring to FIGS. 3 to 5, because the internal electronic elements 13 of the shield can 20 cause the electromagnetic interference by the internal electronic elements 13, the separation wall 50 may be formed between the internal electronic elements 13 causing electromagnetic interference.

FIG. 4 is a plan view illustrating a shield can of a mobile terminal according to an exemplary embodiment of the present invention.

Referring to FIG. 4, the separation wall 50 is formed with the plurality of gaskets 30. That is, the plurality of gaskets 30 are formed with the separation wall 50 of the shield can 20.

The gaskets 30 are separated from each other and are installed in parallel along a straight line. One end of the gasket 30 is surface-mounted in the main circuit board 10 and the other end thereof is coupled to one surface of the inside of the shield can 20. That is, the same surface mounting process can be performed in the gaskets 30, as in other electronic elements. The surface mounting can be performed through a reflow process of Surface Mount Technology (SMT).

When one end of the gasket 30 surface-mounts, the other end of the gasket 30 is coupled and mounted to the ground portion 17 of the main circuit board 10, as in the shield can 20. Additionally, line A-A' of FIG. 4 is further illustrated in FIG. 5 as a side cross-sectional view of the shield can.

FIG. 5 is a side cross-sectional view of a shield can of a mobile terminal according to an exemplary embodiment of the present invention.

Referring to FIG. 5, the other end of the gasket 30 elastically contacts with one side of an upper surface of the inside of the shield can 20. In order to perform an elastic contact, a height of the gasket 30 is a little larger than that of an upper surface of the inside of the shield can 20. Further, the gasket 30 may be fixed to the shield can 20 using conductive adhesives in addition to an elastic contact. The gasket 30 may be made of a conductive material and an elastic material.

Referring to FIGS. 3 and 4, the internal electronic elements 13 may be, for example, a power amplifier and a low noise amplifier of an RF module, or a television reception chip and a Global Positioning System (GPS) reception chip of a DMB module. The internal electronic elements 13 are sensitive to electromagnetic waves, and when electromagnetic interference occurs, an abnormal operation may occur. Therefore, electromagnetic waves occurring between the internal electronic elements 13 can be removed through the gasket 30.

In an exemplary embodiment of the present invention, the gaskets 30 are separated. However, an installing form of the gaskets 30 is not limited thereto, and as the gaskets 30 are coupled to each other, the separation wall 50 may be integrally formed. That is, in order to remove separation space between the gaskets 30, the gaskets 30 may contact to each other and be surface-mounted to the main circuit board 10, or the integrally formed gasket 30 may be used. Both side surfaces of the integrally formed gasket 30 are coupled to both side surfaces of the inside of the shield can 20. That is, when both side surfaces are coupled, both side surfaces elastically contact.

In an exemplary embodiment of the present invention, one separation wall 50 is formed in one shield can 20. However, it is not limited thereto and at least one shield can 20 can be used, and at least one separation wall 50 formed with the gasket 30 can be formed within the shield can 20. Further, one shield can 20 is used, and at least one separation wall 50 can be formed in one shield can 20. The latter can reduce cost and improve space efficiency within the mobile terminal.

By forming the separation wall 50 with the gaskets 30 at the inside of the shield can 20, electromagnetic interference can be prevented from occurring between the internal electronic elements 13.

Further, because the separation wall 50 is formed on the main circuit board 10, when the separation wall 50 is coupled to the shield can 20, a position thereof can be easily set.

When the gasket 30 is surface-mounted, as in other electronic elements, the gasket 30 is mounted together with the separation wall 50 and thus a manufacturing process of the separation wall 50 is simplified and cost thereof can be reduced.

As described above, according to exemplary embodiments of the present invention, in a shield can, a separation wall is mounted in a main circuit board and shield ability can thus be improved. Moreover, when the separation wall is coupled to the shield can, a position thereof can be easily set, and simplified manufacturing process of the separation wall can reduce cost.

While the invention has been shown and described with reference to certain exemplary embodiments thereof, it will be understood by those skilled in the art that various in form and details may be made therein without departing from the spirit and scope of the invention as defined in the appended claims and their equivalents.

What is claimed is:

1. An apparatus comprising
a housing including a display and a printed circuit board (PCB), the display formed over the printed circuit board (PCB);
electronic elements mounted on the PCB, the electronic elements including a first electronic element and a second electronic element;
a side wall mounted on the PCB and formed from a plurality of conductive elastic components disposed between the first electronic element and the second electronic element, all of the plurality of conductive elastic components disposed in a linear pattern; and
a shield member covering the first electronic element and the side wall.

2. The apparatus of claim 1, wherein the conductive elastic components are soldered to a ground portion of the apparatus.

3. The apparatus of claim 1, wherein the plurality of conductive elastic components are spaced apart from each other.

4. The apparatus of claim 1, wherein the conductive elastic components are electrically coupled with a surface of the PCB.

5. The apparatus of claim 1, wherein the conductive elastic components have an opening.

6. The apparatus of claim 1, wherein the shield member is disposed on the PCB.

7. The apparatus of claim 1, wherein another portion of the shield member includes conductive hard portion.

8. The apparatus of claim 7, wherein the conductive hard portion is coupled with the conductive elastic components using a fixing member.

9. An apparatus comprising:
a printed circuit board (PCB);
electronic elements mounted on the PCB, the electronic elements including a first electronic element and a second electronic element;
a plurality of conductive elastic components mounted on the PCB, and disposed between the first electronic element and the second electronic element, all of the plurality of conductive elastic components disposed in a linear pattern; and
a shield member covering the first electronic element, the second electronic element, and the plurality of conductive elastic components.

10. The apparatus of claim 9, wherein the shield member comprises a shield can.

11. The apparatus of claim 9, wherein at least one portion of the shield member is fixed to a ground portion of the apparatus using a fixing member.

12. The apparatus of claim 11, wherein the fixing member comprises at least one of a solder or conductive adhesive material.

13. The apparatus of claim 9, wherein the shield member includes a conductive hard portion.

14. The apparatus of claim 13, wherein the conductive hard portion is coupled with the conductive elastic components.

15. An apparatus comprising:
- a substrate;
- electronic elements mounted on the substrate; and
- a shield member including a side wall formed from conductive elastic components being spaced apart from each other,
- wherein all of the plurality of conductive elastic components disposed in a linear pattern, and
- wherein at least one portion of the shield member covers at least one of the electronic elements.

16. The apparatus of claim 15, wherein the shield member is disposed on the substrate.

17. The apparatus of claim 15, wherein the conductive elastic components are is fixed to the ground portion of the apparatus using a fixing member.

18. The apparatus of claim 17, wherein the fixing member comprises at least one of a solder or conductive adhesive materials.

19. The apparatus of claim 15, wherein the shield member includes a non-elastic portion.

20. The apparatus of claim 19, wherein the non-elastic portion is coupled with the conductive elastic components.

* * * * *